United States Patent
Richardson

[11] Patent Number: 6,032,052
[45] Date of Patent: *Feb. 29, 2000

[54] APPARATUS AND METHOD FOR DATA TRANSMISSION

[75] Inventor: Andrew Richardson, Surrey, United Kingdom

[73] Assignee: Nokia Mobile Phones Ltd., Salo, Finland

[*] Notice: This patent is subject to a terminal disclaimer.

[21] Appl. No.: 08/571,529

[22] Filed: Dec. 13, 1995

[30] Foreign Application Priority Data

Dec. 23, 1994 [GB] United Kingdom .................. 9426228

[51] Int. Cl.⁷ ...................................................... H04B 1/10
[52] U.S. Cl. ........................... 455/522; 455/63; 455/506; 375/200
[58] Field of Search .............................. 455/69, 126, 127, 455/88, 70, 54.1, 43, 63, 65, 103, 506, 522, 503, 102; 375/200; 370/527, 529

[56] References Cited

U.S. PATENT DOCUMENTS

| | | | |
|---|---|---|---|
| 4,567,602 | 1/1986 | Kato et al. | 375/60 |
| 4,941,198 | 7/1990 | Johnson et al. | 455/9 |
| 5,056,109 | 10/1991 | Gilhousen et al. | 375/1 |
| 5,129,098 | 7/1992 | McGirr et al. | 455/69 |
| 5,201,060 | 4/1993 | Haruyama et al. | 455/45 |
| 5,345,598 | 9/1994 | Dent | 455/54.1 |
| 5,349,630 | 9/1994 | Sointula | 379/58 |
| 5,396,653 | 3/1995 | Kivari et al. | 455/88 |
| 5,430,740 | 7/1995 | Kivari et al. | 371/37.1 |
| 5,579,306 | 11/1996 | Dent | 370/50 |
| 5,596,570 | 1/1997 | Soliman | 370/252 |
| 5,603,096 | 2/1997 | Gilhousen et al. | 455/69 |
| 5,905,962 | 5/1999 | Richardson | 455/522 |

FOREIGN PATENT DOCUMENTS

| | | |
|---|---|---|
| 0 110 009 | 6/1984 | European Pat. Off. . |
| 0110009A1 | 6/1984 | European Pat. Off. . |
| 0 369 135 | 5/1990 | European Pat. Off. . |
| 0369135 A2 | 5/1990 | European Pat. Off. . |
| 0369135 | of 0000 | United Kingdom . |
| 0 369 135 | 5/0000 | United Kingdom . |
| WO 93/17506 | 9/1993 | WIPO . |

OTHER PUBLICATIONS

Japanese Abstract No. 1–227534, Nippon Telegr & Teleph Corp, Sep. 11, 1989 "Mobile Communication Control System".

The GSM System for Mobile Communications by Michael Mouly and Marie–bernadette Pautet, pp 1–699, 1992.

Japanese Patent Abstract No. 1–227534, "Mobile Communication Control System", Nippon Telegraph, Nov. 9, 1989.

*Primary Examiner*—John W. Miller
*Assistant Examiner*—Christopher Onuaku
*Attorney, Agent, or Firm*—Perman & Green, LLP

[57] ABSTRACT

Radio communication apparatus for transmitting control data, comprising output power amplifying means responsive to a control signal from an output power control means for varying a predetermined output power level from the output power amplifying means in accordance with a sequence of power levels indicative of a control message. The predetermined output power level is selectable from a range of predetermined power levels and may be variable between power levels of adjacent predetermined power levels for the range of predetermined power levels. Typically, the control message is a request to vary the output power level for inhibiting radio signal fading.

26 Claims, 3 Drawing Sheets

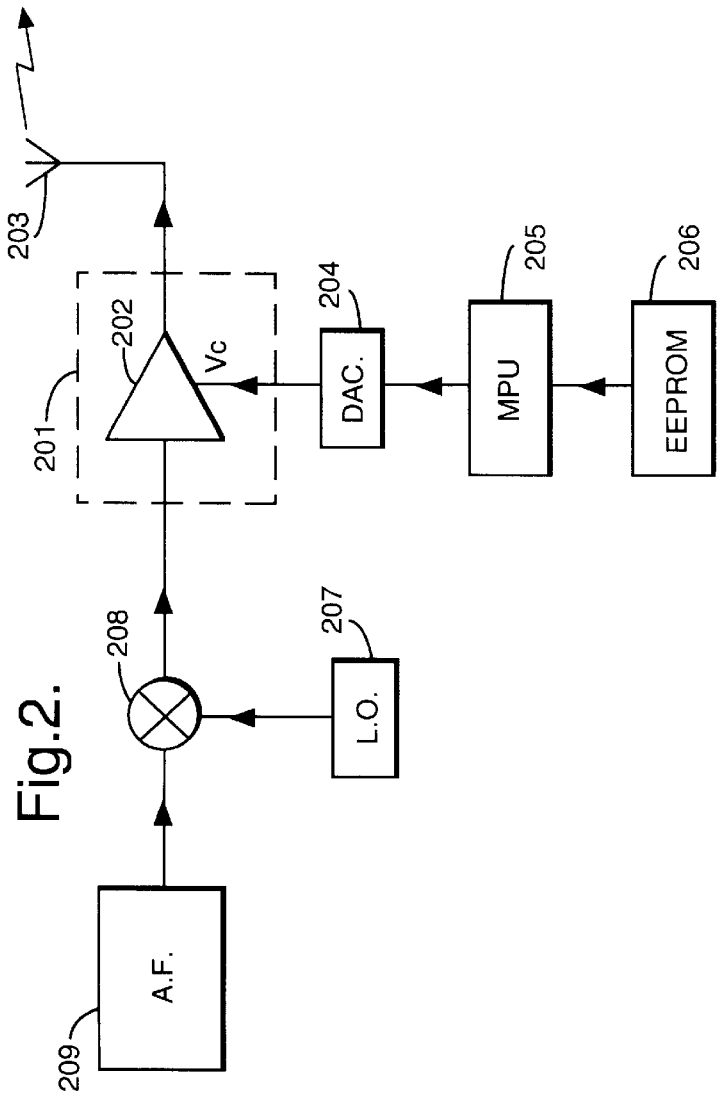

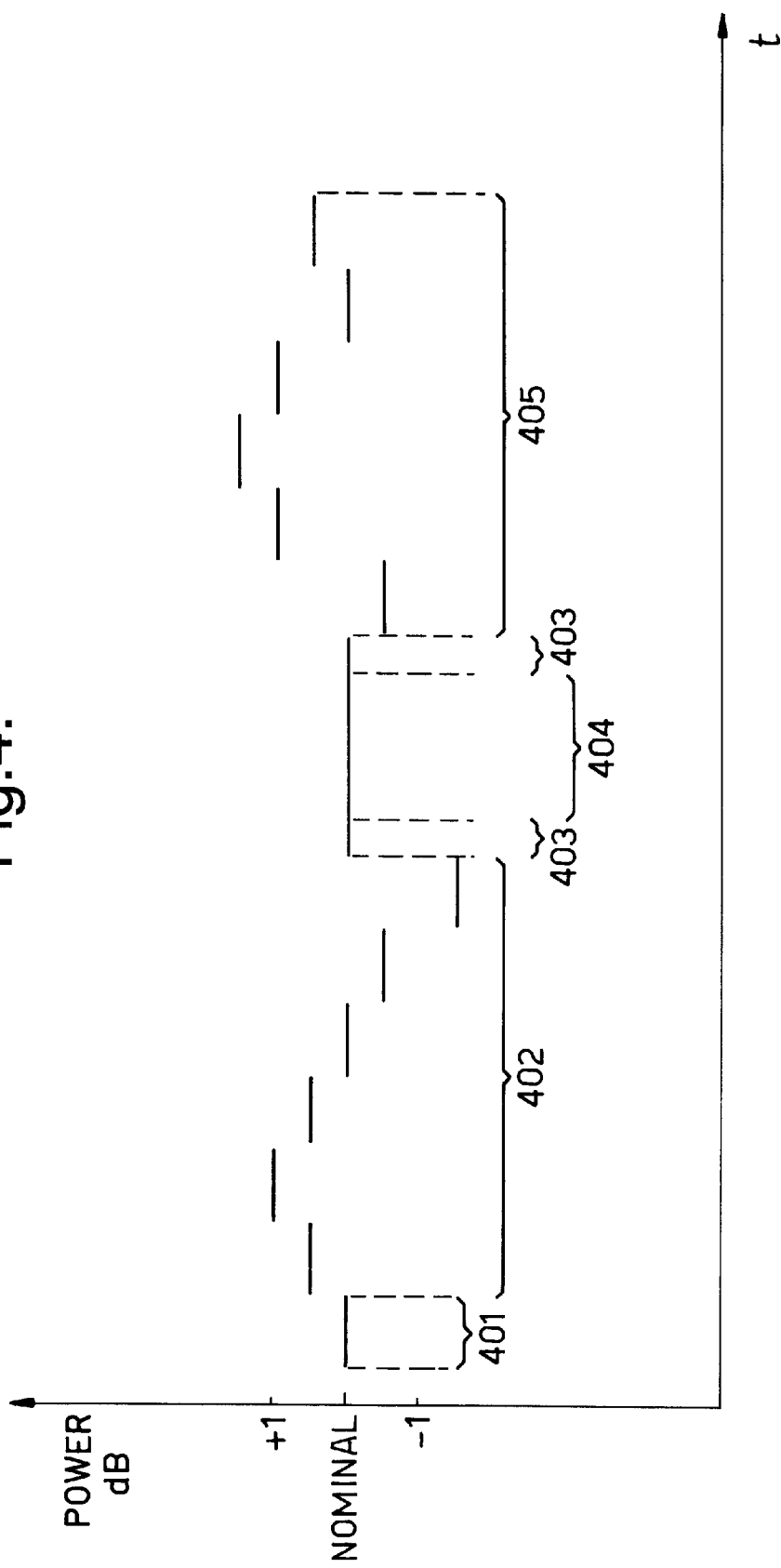

APPARATUS AND METHOD FOR DATA TRANSMISSION

FIELD OF INVENTION

The present invention relates to apparatus and a method for controlling the output power of communication devices and to a communication system utilising the apparatus and method. In particular the present invention relates to power control circuitry in a communication system such as a radio telephone network.

BACKGROUND TO INVENTION

Existing communication systems suffer from a number of problems which act to degrade the quality of communication between a transmitting unit and a receiving unit within the communication system. In particular, in a radio telephone network for example, which comprises a plurality of mobile stations or radio telephones communicating with a base station connected to other base stations in the radio telephone network, both the radio telephone and the base station are relatively close to ground level. Since the base station and radio telephone are close to ground level obstacles such as buildings, walls, cars and people hinder the direct line of sight between them especially in urban areas. Thus, they typically communicate by reflected or diffracted radio wave signals. Due to the multiple reflections and diffractions the r.f. power received by a radio telephone or a base station is at a much lower level than would be expected from the inverse square law if direct line of sight communication was possible. Typically, the power loss is of the form $d^{-\alpha}$ where d is the distance between the transmitting and receiving stations and $\alpha$ lies between 3 and 4. This power loss is known as path loss.

The problem of path loss has been addressed in known radio telephone systems by the base stations monitoring the strength of signals received from various radio telephones communicating therewith and from time to time issuing a request over the air for an individual radio telephone to increase or decrease its transmitting power. The radio telephone responds by adjusting the gain of its transmitting amplifier which is typically under microprocessor control. Generally, the amplifier is operable at one of a plurality of predetermined output power levels which are selected automatically in response to the request from the base station for a change in the level of the output power. Typically, the power levels are defined in the radio telephone system specification. For each power level a nominal value is specified together with a permitted tolerance range.

In addition to the normal fading there is another form of fading known as Rayleigh fading. This type of fading is a short term fading and is characterised by rapid variations in the r.f. power level of a signal received by a radio telephone or base station. It is caused by the multiple signal paths arising from the reflections and diffractions forming a quasi-stationary standing wave pattern with nulls at approximately half wavelength intervals of the signal frequency.

The effect of the periodic nulls in received signal power due to Rayleigh fading is that transmitted data may be lost thereby introducing errors into the transmission of data. In order to ensure that there is sufficient integrity in the radio telephone network redundant data has to be sent such as error-correcting codes. This results in a reduced information or data handling capacity for the network.

Heretofore, the problems of Rayleigh fading have been addressed by using a technique known as Slow Frequency Hopping (SFH) or Frequency Hopping. In this technique, the carrier frequency of a particular communication channel is discontinuously changed between discrete carrier frequencies of a set of defined carrier frequencies. Since the Rayleigh fading of signals at different frequencies is not the same, and becomes increasingly different as the difference between the frequencies increases, frequency hopping for a particular communication channel substantially reduces the effects of Rayleigh fading for that communication channel effectively transforming errors due to Rayleigh fading into widely spread random errors. Another advantage is that co-channel interference from other cells is reduced.

In the known GSM system for cellular radio telephony, the sequence of data bursts making up a particular communication channel or Traffic CHannel (TCH) are cyclically assigned to different frequencies by the base station handling that communication channel. Additionally, a technique known as interleaving is employed in the GSM system. This involves jumbling up data to be transmitted such that normally adjacent groups of data are transmitted at different times, and de-interleaving the transmitted signal at the receiver.

A disadvantage of a system using frequency hopping is that the "memory" of the radio propagation channel is lost. This so-called "memory" arises because a radio propagation channel can be considered a time-variant linear filter. Such a filter has a well-defined auto-correlation function, and there is a limit to the variation in a signal level between two closely spaced points (of the order of a half wavelength). If a signal strength is known at one point then with a defined confidence interval it can be predicted at a next closely spaced point. Thus, the radio propagation channel can be considered to have a "memory".

Loss of the memory of a communication channel results in accurate and fast power control being difficult to achieve. Furthermore, frequency hopping does not remove the generation of r.f. signal nulls and overcoming such nulls by fast power control cannot be achieved since there is no memory in the communication channel and the occurrence of nulls cannot be predicted. Additionally, frequency hopping requires relatively complex circuitry both in the base stations and radio telephones in order to ensure that the correct frequency is used at each time. In particular, the frequency synthesizers and the Tx and Rx circuitry are complex. There must also be a substantial number of carrier frequencies for the communication channels to jump to and this may not always be possible in a crowded r.f. spectrum. Also, it is possible that two or more different communication channels will simultaneously land on the same frequency which will cause gross interference.

BRIEF SUMMARY OF INVENTION

In a first aspect the present invention provides radio communication apparatus for transmitting control data, comprising output power amplifying means responsive to a control signal from an output power control means for varying a predetermined output power level from the output power amplifying means in accordance with a sequence of power levels indicative of a control message and in a second aspect the present invention provides a method for transmitting control data between a transmission means and a receiving means in a communication system, comprising varying a predetermined output power level from the transmission means in accordance with a sequence of power levels indicative of a control message.

The invention has the advantage that control data can be transmitted between a receiver and a transmitter simultaneously with traffic data. Thus, control of the transmitted signals can be instantaneously achieved. Suitably, the predetermined output power level is selectable from a range of power levels which may be the system defined power levels used to inhibit slow fading. Particularly, the predetermined output power level is variable between power levels of adjacent predetermined power levels for the range of predetermined power levels.

In a preferred embodiment of the invention the control message is an output power level control message for inhibiting radio signal fading. Due to the almost instantaneous power control which can be achieved by using an invention in accordance with the preferred embodiments, radio signal fading can be inhibited by signalling the transmitter to increase its output power appropriately. Typically, by using two or more different spreading waveforms the transmit power can be changed burst by burst to track variations in power. Thus, the extra power output used to provide fade margins can be substantially dispensed with, thereby reducing power consumption and reducing interference between communication channels.

Preferably, the transitions between power levels are filtered and shaped to inhibit spectral spreading. Additionally, the control message may indicate continuous increase or decrease in output power from a transmitter, which reduces rapid variations in the output power level thereby avoiding frequency noise or spectral spreading of the signal.

Advantageously data is divided into groups prior to transmission and the respective groups are transmitted at respective power levels in accordance with the sequence of power levels. This has the advantage that the power level variations do not have to vary at a bit rate for example and therefore the invention is less complex to implement. Additionally, the changes in power-level can be made relatively smoothly and hence there is less noise generated by frequency spreading and consequently less interference with other communication channels.

Optionally, the amplifying means periodically varies the predetermined output power level in accordance with the sequence of power levels which permits a steady output power level to occur. This steady output power level can be used by a receiver to measure the received signal strength and to perform equalisation. Optionally, no steady output power level is provided and the sequence of power levels is known by both the transmission means and the receiving means. In such an embodiment the power variations of the received signal can be decoded or "de-spread" and the received signal strength measured and equalisation carried out on the de-spread signal.

Typically, the power levels in the sequence of power levels lies in a 20 dB power range relative to the predetermined output power level and have a step size of 1, 2, 3 or 5 dB. Small step sizes are advantageous since they inhibit frequency spreading and noise interference with other channels. Also they permit a large number of different sequences to be devised which results in greater number of possible messages.

BRIEF DESCRIPTION OF THE DRAWINGS

FIG. 2 shows a circuit suitable for implementing the invention;

FIG. 3 shows the structure of a normal GSM traffic burst; and

FIG. 4 shows an example of a sequence of power-levels applied to a normal GSM traffic burst in accordance with the invention.

DETAILED DESCRIPTION OF EMBODIMENTS OF THE INVENTION

Figure 1:
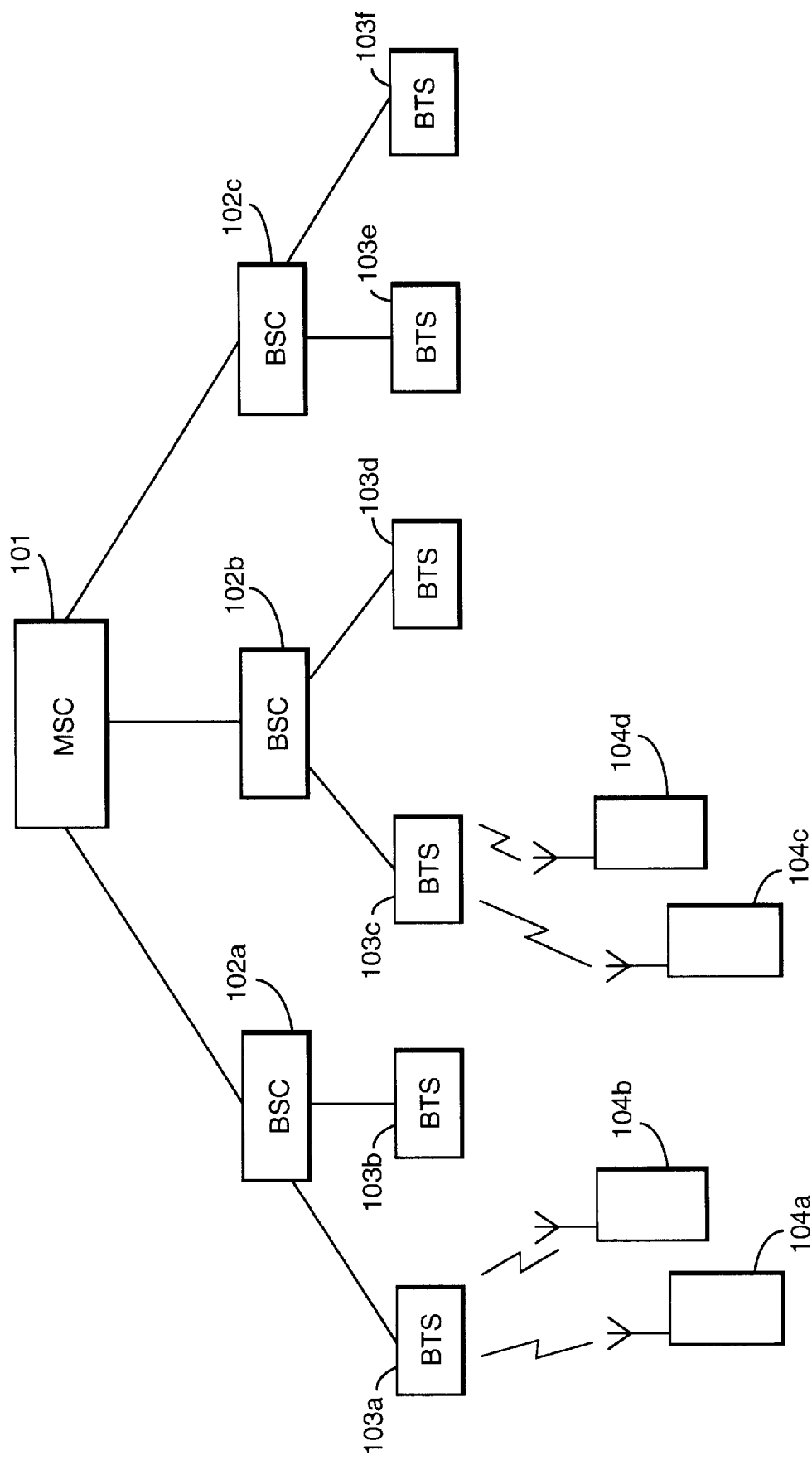
FIG. 1 shows a schematic of a GSM cellular telephone network.

Embodiments of the present invention will now be described by way of example only, and with reference to the accompanying drawings.

FIG. 1 shows a diagrammatic representation of a cellular radio telephone network such as a GSM network. Mobile Switching Centre (MSC) 101 is associated with Base Station Controllers (BSC) 102 for controlling the Base Transceiver Stations (BTS) 103. Typically, an MSC 101 is responsible for a number of radio telephone cells which would cover an urban area and its immediately adjacent environment. Each BTS 103 comprises both a receive antenna and a transmit antenna for communicating with a radio telephone 104. It is possible for a BTS 103 and a BSC 102 to be at the same geographical location and within the same housing.

The radio telephone 104 may be a mobile unit installed in a vehicle, a so called transportable unit or a hand held portable unit. The radio telephone 104 comprises an antenna for receiving and transmitting information between the radio telephone 104 and the BTS 103, a transceiver, a keypad and display. Such features and others are conventionally found in a radio telephone 104, and since these aspects are not directly relevant to the instant invention no further details will be given here, except to say that a microprocessor is employed to control the basic functions of the radio telephone 104. Alternatively, the telephone functions may be controlled by a master microcomputer, while the keypad and display functions are under the control of a separate slave microcomputer coupled to communicate with the master microcomputer.

As described earlier, the output power level of a radio telephone 104 can be varied in response to requests from a base station BTS 103. Typical apparatus for performing such control in a radio telephone 104 is shown in FIG. 2. The transmitter power output stage of the radio telephone 104 comprises a power module 201 including a voltage controlled variable gain amplifier 202. The power module amplify signals from mixer 208, which comprise signals from the AF or baseband section 209 of the radio telephone 104 and the local oscillator L.O. 207. The power output of module 201 is determined by control voltage Vc applied to the amplifier 202. The output power of module 201 may be maintained at a nominal uniform level by the use of a conventional level control circuit (not shown) in the form of a negative feed back loop. The control voltage Vc to be applied to the amplifier 202 is determined by microprocessor 205 in response to a request received from a BTS 103 to increase or decrease the output power of the transmitter. A set of values indicative of the set of control voltages to be applied to the amplifier 202 are stored in EEPROM memory 206. The values stored in memory 206 are used by the microprocessor 205 to apply an appropriate signal to a digital-to-analogue converter (DAC) 204 which in turn applies the appropriate control voltage Vc to the amplifier 202.

In accordance with the present invention, memory 206 also stores a second set of values indicative respectively of a set of voltages to be superimposed on the control voltage Vc to vary the output power level from the transmitter from the nominal uniform level determined by the control voltage Vc. Under control of the MPU 205 respective values of the second set of values are sequentially applied to the DAC 204, as for example least significant bits, in order to sequentially vary the output power level of the radio telephone 104.

By way of a particular example, an embodiment in accordance with the invention as applied to the GSM cellular system is now described. The structure of a normal GSM data burst is shown in FIG. 3. A normal GSM data burst comprises the following sequence of bits; 8.25 ramp bits, 3 guard bits (set to Ø), 57 data bits, a stealing flag bit which indicates whether or not the burst is being used for a purpose other than speech transmission such as transmitting control messages, a training sequence of 26 bits for allowing a receiver to precisely determine the position of a useful signal inside a reception window, and to have a good idea of any distortions occurring during transmission of the burst, another stealing flag bit, 57 further data bits and 3 more guard bits. A combination of the guard bits with the data bits results in two fields of 60 bits separated by the training sequence and stealing flag bits. Dividing these two fields into groups of 10 bits results in 12 groups of bits equally divided between the two fields. Each of these groups of 10 bits is transmitted at a power level spread from the nominal power level power level in accordance with the second set of values stored in memory 206 and read by the MPU 205 for programming DAC 204 and controlling the amplifier 202. The sequence defined by the second set of values may extend over a number of GSM bursts before being repeated, for example, every 10 bursts, or can be confined to a single burst or even six groups at a time. The variations in the output power level can be by any amount desired by the designer of the system. Suitably, the variation in output power level may fall within the power range separating the predetermined output power levels defined by the system for overcoming slow normal fading and ensuring efficient use and re-use of the available frequency space in adjacent cells. In the GSM system the respective predetermined output power levels are spaced apart by 2 dB. Thus, there exists a total range of 4 dB in possible output power level variations at a given predetermined output power level, before encroaching on an adjacent predetermined power level.

The variation in output power levels can be in steps of 0.5 dB, 0.3 dB, 0.25 dB, 0.2 dB or 0.1 dB for example. The smaller the separation in power levels the greater the number of power levels available to be used in a sequence. However, the smaller the steps between power levels the less reliable the detection of the variation in output power levels becomes due to noise in the receiver. A compromise needs to be made between the amount of number of variations possible and the reliability required in detecting the variations.

FIG. 4 shows an example of a normal GSM traffic channel burst having the power envelope varied or spread in accordance with the present invention. the ramp bits 401, stealing flags 403 and training sequence bits 404 are at the nominal output power level set by the radio telephone. The two data and guard bit fields 402, 405 are split into groups of 10 bits each transmitted at one of the available second set of power levels and in accordance with the sequence stored in memory 206. As shown in FIG. 4 the second set of power levels are separated by 0.5 dB, although other separations may be possible.

Each sequence can represent a different control message between the radio telephone 104 and the BTS 103. In order for each radio telephone 104 logged onto a particular BTS 103 not to interfere with other radio telephones 104 logged onto the same BTS 103 each radio telephone 104 must have assigned to it a set of power level sequences orthogonal to each set of power level sequences assigned to other radio telephones 104. Each power sequence within a particular set can represent a different control message.

In order for a receiver to be able to equalise an incoming signal and measure the received power it requires either a quasi-stationary signal or some knowledge of the signal. This may be achieved by equalising the signal and, measuring the received signal strength based on the steady signal power level received during the training sequence. Alternatively, the different power levels in a sequence and a set of power levels for a radio telephone 104 can be so defined such that there is very little variation in power level during a sequence or between sequences of a set of power levels. Thus, although different control messages may be transmitted, the signals remain quasi-stationary. The 104 may estimate which control message was used and use that information to pre-bias the equalisation and power measurement circuits so that they can function correctly.

Clearly, an incorrect decision on spreading sequence will affect the performance of the equaliser. However, if only a small number of possible sequences are used, the chances of erroneous decision can be made significantly small enough such that if an error occurs in this estimation process, then a significant number of errors would have occurred in the transmitted signal in any case.

In a particular embodiment in accordance with the invention, the control messages are used to inhibit the effects of Rayleigh fading. As mentioned earlier, a radio communication channel has a memory which permits characteristics, such as signal strength, of a radio signal to be predicted. Thus, the system can have knowledge of an impending Rayleigh fade prior to its occurrence. This applies to both radio telephones 104 and BTSs 103. If a receiver, radio telephone 104 or BTS 103, communicates information about an impending fade, or expected increase in receive power out of a fade, to its associated transmitter then the transmitter can increase or decrease its output power level to compensate for the fade, or expected increase in received power. This can be achieved by each set of orthogonal sequences mentioned earlier associated with each transmitter/receiver pair indicating to the transmitter what increase/decrease in power is required. The increase/decrease in power can be in terms of steps up to 1, 2, 3 or 5 dBs for example. Thus, the transmitter can back the fading process at the receiver by virtue of the power control messages transmitted to it from the receiver.

Optionally, a simplified system could be utilised in which each transmitter/receiver pair is assigned two simple sequences for indicating an increase or decrease in power respectively. Thus, the transmitter can be informed by the receiver whether to continuously increase or decrease the transmitted power to mitigate against the fading process. A third sequence could also be included which indicates no power level change.

Power control as described above, decreases the variations in received signal power level and thus the statistics of the received signal may be modified by reducing the variance of the distribution.

As a radio telephone moves from cell to cell, the particular sequence of power levels for control messages may be different to that currently used by the radio telephone or already assigned to another radio telephone already in the cell. thus, a radio telephone 104 will either have to share several different sequences of power levels and have a respective BTS 103 indicate which sequences are to be used by that particular radio telephone. Optionally, the BTS 103 can transmit to the radio telephone 104 information for storage in the memory means 206 about which sequence of power levels are to be used by the radio telephone 104. This obviates the need for the radio telephone 104 to store many different sequences of power levels.

In view of the foregoing description it will be evident to a person skilled in the art that various modifications may be made within the scope of the invention. In particular, that apparatus and method in accordance with the present invention can be employed by base stations as well as radio telephones.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What I claim is:

1. Radio communication apparatus for transmitting control data to at least one base station of a radio telephone system, the radio communication apparatus comprising output power amplifying means responsive to a control signal from an output power control means for varying a predetermined output power level from the output power amplifying means in accordance with a sequence of power levels representative of a control message intended for transmission from the radio communication apparatus to the base station.

2. Radio communication apparatus according to claim 1, wherein the predetermined output power level is selectable from a range of predetermined power levels.

3. Radio communication apparatus according to claim 2, wherein the predetermined output power level is variable between power levels of adjacent predetermined power levels for the range of predetermined power levels.

4. Radio communication apparatus according to claim 1, wherein transitions between respective power levels are filtered and shaped to inhibit spectral spreading.

5. Radio communication apparatus according to claim 1, wherein said control message is an output power level control message for inhibiting radio signal fading.

6. Radio communication apparatus according to claim 5, wherein the output power level control message is indicative of a request to a transmitting means to vary transmitted power by a discrete amount.

7. Radio communication apparatus according to claim 5, wherein the output power level control message is indicative of a request to a transmitting means to smoothly increase or decrease transmitted power.

8. Radio communication apparatus according to claim 1, adapted to divide data into groups prior to transmission and wherein respective groups are transmitted at respective power levels in accordance with said sequence of power levels.

9. Radio communication apparatus according to claim 1, wherein the control means is operative to periodically control the amplifying means in accordance with said sequence of power levels.

10. Radio communication apparatus according to claim 8 operative for a GSM radio telephone network, wherein 3 guard bits and 57 data bits on each side of the midamble of a data burst are divided into respective groups of 10 bits for transmission at respective power levels is said sequence of power levels.

11. Radio communication apparatus according to claim 1, wherein the power levels in said sequence of power levels lie in a 20 dB power range relative to said predetermined output power level and have a step size of ±1, ±2, ±3 or ±5 dB.

12. Radio communication apparatus according to claim 3, wherein the power levels in said sequence of power levels lie in a 4 dB range relative to the predetermined output power level and have a step size of ±0.1, ±0.2, ±0.25, ±0.3, ±0.4, or ±0.5 dB.

13. A method for transmitting control data between a transmitting means and at least one receiving means in a communication system, comprising the step of sequentially varying a predetermined output power level from the transmitting means in accordance with a sequence of power levels that is selected to represent a control message intended for transmission from the transmitting means to the receiving means.

14. A method according to claim 13, wherein the predetermined output power level is selectable from a range of predetermined power levels.

15. A method according to claim 14, wherein the predetermined output power level is variable between power levels of adjacent predetermined power levels for the range of predetermined power levels.

16. A method according to claim 13, wherein transitions between respective power levels are filtered and shaped to inhibit spectral spreading.

17. A method according to claim 13, wherein said control message is an output power level control message for inhibiting radio signal fading.

18. A method according to claim 17, wherein the power level control message is indicative of a request to vary a transmitted power by a discrete amount.

19. A method according to claim 17, wherein the output power level control message is indicative of a request to smoothly increase or decrease a transmitting power.

20. A method according to claim 13, wherein power control means is operative to control amplifying means in accordance with different sequences of power levels.

21. A method according to claim 13, wherein the power levels in said sequence of power levels lie in a 20 dB power range relative to said predetermined output power level and have a step size of 1, 2, 3 or 5 dB.

22. A method according to claim 13, wherein the power levels in said sequence of power levels lie in a 4 dB range relative to the predetermined output power level and have a step size of ±0.1, ±0.2, ±0.25, ±0.3, ±0.4, or ±0.5 dB.

23. A method according to claim 13, wherein predetermined output power levels of radio signals for different communication channels are varied in accordance with different sequences of power levels.

24. A radio communication apparatus for transmitting information over a radio link to at least one base station of a radio telephone system, said radio communication apparatus comprising:

a transmitter for producing a RF transmission signal at a transmit power level; and output power control means for producing a control signal that is coupled to said transmitter;

wherein said control signal directs said transmitter to vary said transmit power level of said transmission signal to produce a time-sequence of power levels, within a portion of said transmission signal, which represent a control message for conveying information to the base station, said control message being descriptive of a characteristic of the radio link.

25. A method for transmitting information between a transmitter and at least one receiver over a radio link in a wireless communication system, comprising the steps of:

transmitting first information by modulating a RF carrier in accordance with the first information; and simultaneously transmitting second information by modulating a transmit power of the RF carrier in accordance with the second information, the second information comprising a control message containing information that is descriptive of the radio link.

26. A method for transmitting information as in claim 25, wherein the transmitter is assigned a set of power level sequences, representative of at least one control message, for modulating the transmit power, and wherein the assigned set of power level sequences is orthogonal to a set of power level sequences assigned to at least one other transmitter.

* * * * *

UNITED STATES PATENT AND TRADEMARK OFFICE
CERTIFICATE OF CORRECTION

PATENT NO.  : 6,034,052
DATED       : March 7, 2000
INVENTOR(S) : Alfred Körber et al.

It is certified that error appears in the above-identified patent and that said Letters Patent is hereby corrected as shown below:

On the Title Page

In column 1, item [54], before "MUSK" insert --NOVEL--.

In column 1, after line 6, insert new item
--Assignee: Haarmann & Reimer GmbH, Holzminden, Germany--.

Signed and Sealed this

Eighth Day of May, 2001

Attest:

NICHOLAS P. GODICI

Attesting Officer

*Acting Director of the United States Patent and Trademark Office*